United States Patent
Macomber et al.

(12) 
(10) Patent No.: US 6,750,538 B2
(45) Date of Patent: Jun. 15, 2004

(54) HEAT TRANSFER OF SOLID-STATE DEVICES

(75) Inventors: Steven Henry Macomber, Tucson, AZ (US); Jeffrey Powers, Tucson, AZ (US)

(73) Assignee: Spectra Physics Semiconductor Lasers, Inc., Tucson, AZ (US)

( * ) Notice: Subject to any disclaimer, the term of this patent is extended or adjusted under 35 U.S.C. 154(b) by 22 days.

(21) Appl. No.: 10/279,685

(22) Filed: Oct. 24, 2002

(65) Prior Publication Data

US 2004/0080042 A1 Apr. 29, 2004

(51) Int. Cl.[7] ............................................. H01L 23/34

(52) U.S. Cl. ...................................... 257/718; 257/719

(58) Field of Search ................... 257/718–722; 438/107–117

(56) References Cited

U.S. PATENT DOCUMENTS 5,394,426 A * 2/1995 Joslin ........................ 372/50
5,654,587 A * 8/1997 Schneider et al. ......... 257/718

* cited by examiner

*Primary Examiner*—Cuong Nguyen
(74) *Attorney, Agent, or Firm*—Howard R. Popper

(57) ABSTRACT

In order to provide an improved heat transfer interface between an solid state device and a heat sink to which it is soldered, one or more "vents" are provided in the interface between the solid state device and the heat sink to prevent the entrapment of gases that could form solder voids. Advantageously, the provision of such vents in the interface surface geometry of the semiconductor may be effected by the use of appropriate masking and etching following the epitaxial regrowth process. Alternatively, the heat sink or a solder preform may be provided with suitable notches. The use of such "die-bond vents" also allows solder, after melting, to be forced under the chip by external gas pressure such that no solder voids are left.

3 Claims, 3 Drawing Sheets

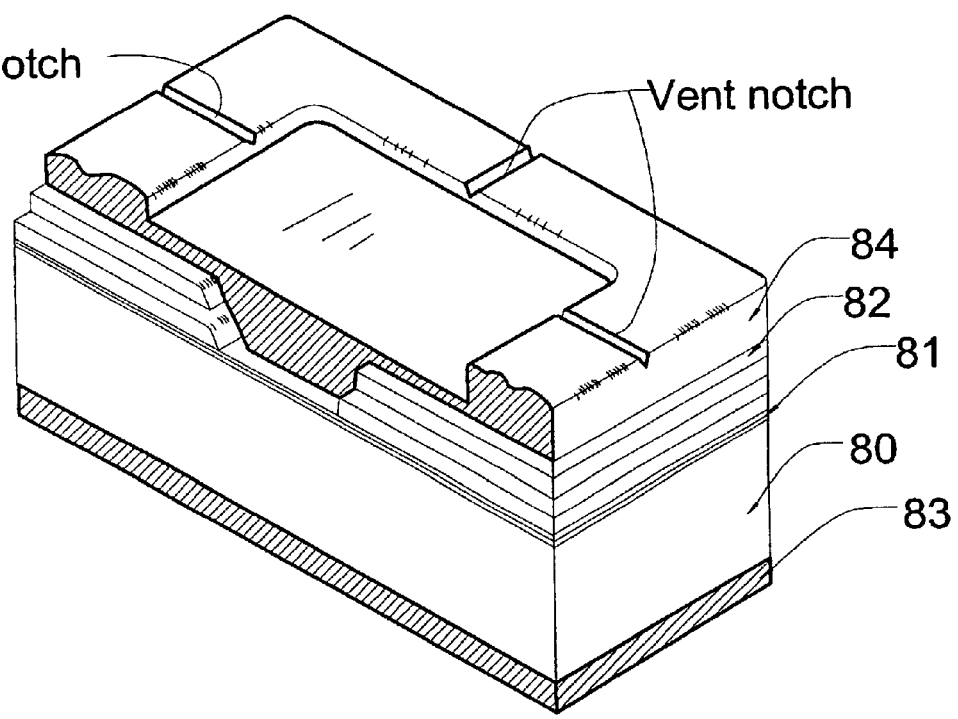

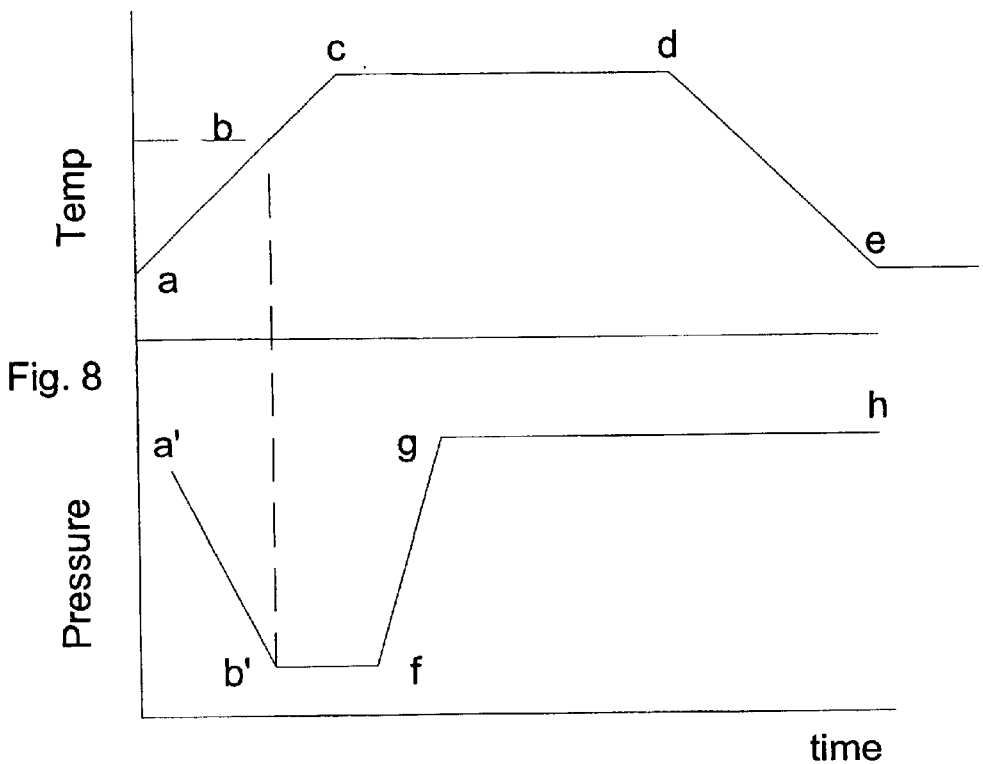
Fig. 8
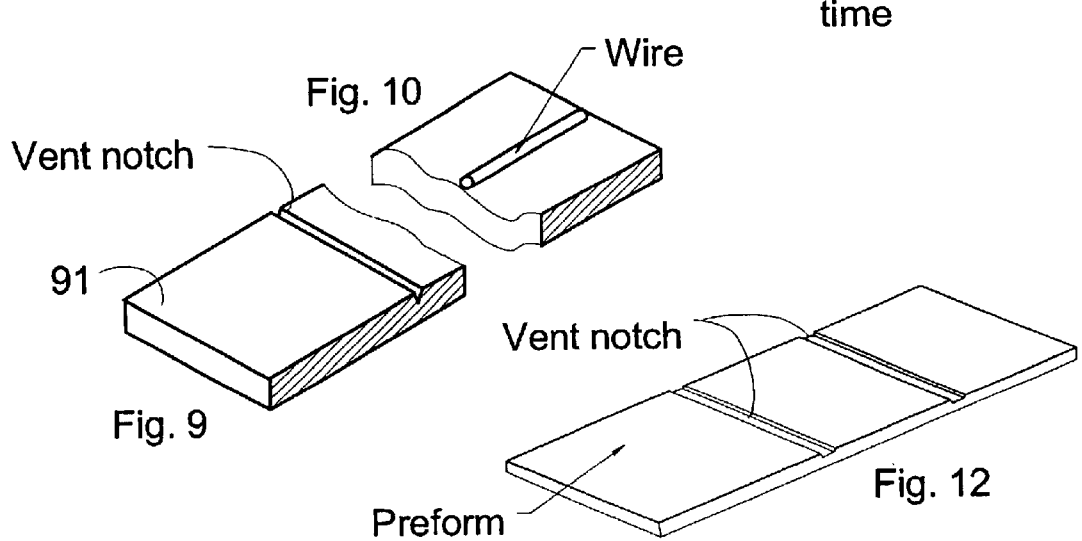
Fig. 9
Fig. 10
Fig. 12
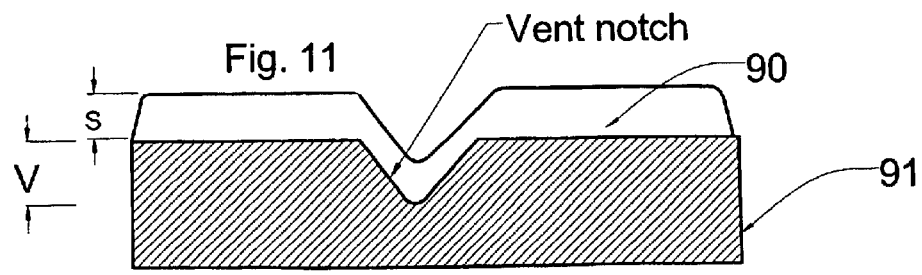
Fig. 11

HEAT TRANSFER OF SOLID-STATE DEVICES

FIELD OF THE INVENTION

This invention relates to semiconductor devices and, more particularly, to solid state devices such as laser diodes that require the use of heat sinks for proper operation.

BACKGROUND OF THE INVENTION

The manufacture of semiconductor devices typically involves the growth of epitaxial layers on a suitable substrate either by vapor or liquid phase metalo-organic chemical deposition, followed by various steps that may employ different combinations of photolithographic resist masking, the etching away of certain layers and the overgrowth of other layers of semiconductor material, insulating oxides and metalization.

In laser diode semiconductor devices, high current densities are employed that generate heat. The internally generated heat must be transferred through a semiconductor surface interface to an external heat sink. At the interface, the solder that bonds the chip to the heat sink provides both an electrical and heat transfer path. Typical solder materials include indium, gold-tin, silver-tin, and lead-tin. Heatsinks are made of such materials as copper or copper-tungsten or metallized, thermally conductive ceramics such as alumina, berylia, diamond, and cubic boron nitride. In one commonly used process, the solder metal e.g., indium, is evaporated onto the heatsink surface in chamber using a standard e-gun or thermal evaporator. Then the solder is removed from the evaporator. The chip is placed on top of the solder coated heatsink, and a weight or spring force is used to hold the chip in place. The assembly is run through a temperature and atmosphere controlled cycle to "reflow" the solder and then cooled to solidify the solder so that the chip is affixed to the heatsink.

An alternative soldering procedures involves the use of solder "preforms". When solder preforms are used, the heat sink is placed in an oven and a preform is placed on the heat sink with the chip on top of the preform. The oven is heated until the preform melts and then the assembly is cooled to affix the chip to the heat sink.

It is well known that surface oxidation and/or contamination can lead to poor wetting of the solder at the surface interface between the heat sink and the chip, or "die". Despite the use of efficient heat sink structures, careful cleaning of the die, the use of appropriate solders and the employment of drive currents in operation that are within prescribed ranges, some device failures continue to occur. The several watts of heat produced by a typical high-power semiconductor laser device emanates from an area that may typically be of the order of 0.1 mm×2 mm, producing on the order of 1–5 kilo-watts cm$^2$ of heat flux.

Microscopic analysis of devices that have failed due to overheating sometimes reveals the existence of gaps in the solder bond between the semiconductor device and the heat sink. Such gaps reduce the amount of interface area available for effective heat transfer and permit critical overheating in localized areas. Even a small void in the solder-bond can give rise to hot spots inside the laser device under these conditions. Local hot spots encourage the growth of defects that shorten the life of the device. They also produce local refractive index variations that can degrade the output beam quality in the case of a laser device.

SUMMARY OF THE INVENTION

We have discovered that localized overheating between the semiconductor device and the heat sink tends to occur when gasses are entrapped during the process of soldering the chip to the heat sink. Entrapped gasses prevent the even reflow of solder. In accordance with the principles of our invention, one or more gas vents are provided in the interface surface geometry to prevent the formation of solder voids during the soldering process. Advantageously, the provision of such vents in the interface surface geometry may be effected by the use of appropriate masking and etching of the semiconductor device following the epitaxial re-growth process. Alternatively, gas vents may be provided in the heat sink or in the solder preform. The use of such "diebond vents" also allows the chamber in which soldering is performed to be pressurized so as to force molten solder into the interface without danger of entrapping gas that would cause a solder void in the interface.

BRIEF DESCRIPTION OF THE DRAWING

The foregoing and other objects and features of the invention may become more apparent from a reading of the ensuing description together with the drawing in which:

FIGS. 5 and 6 show the process of the invention for venting the interface surface of a solid state device;

FIG. 7 is an isometric view of the interface surface of a solid state device having vents provided in accordance with the process of FIGS. 5 and 6;

FIG. 8 shows the temperatures and pressures employed in a soldering chamber in accordance with the invention;

FIG. 9 shows an alternative embodiment in which the heat sink is grooved to provide a vent notch for the escape of gasses;

FIG. 10 shows a further alternative embodiment in which a thin solder wire is used to provide a vent path;

FIG. 11 is an enlarged view of the heat sink vent notch of FIG. 9 onto which solder has been evaporated; and FIG. 12 shows a still further alternative embodiment in which a solder preform is provided with a vent notch.

DETAILED DESCRIPTION

Figure 1:
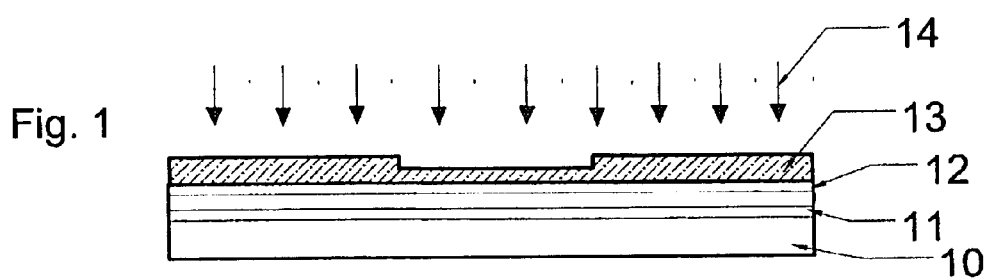
FIGS. 1 through 3 show the steps typically employed in fabricating prior art solid state devices using masking, etching, epitaxial deposition, and re-growth processes.

In the conventional process of making solid state devices, such as semicondutor laser diodes, one starts with a multi-layered wafer. The wafer has room for defining a number of locations for semiconductor devices. FIG. 1 shows one such device depicted as having a substrate 10, a number of layers 11 through 12 typically including confinement layers, cladding layers and one or more waveguide layers (shown undifferentiated) in the Figs. To provide for a metallic contact layer having a stripe, a photoresist 13 is applied in preparation for further processing which typically includes exposure to ultra-violet or other light through a mask (not shown) to define areas to be etched away to provide for a grating (not shown) and to accommodate the metallic contact layer and stripe. Photoresist 13 will be developed and various kinds of acid etchants 14 will be applied to etch away particular layers, as is well-known. Then epitaxial layers of insulating silicon and metalization will be regrown over portions of the etched layers.

Figure 2:
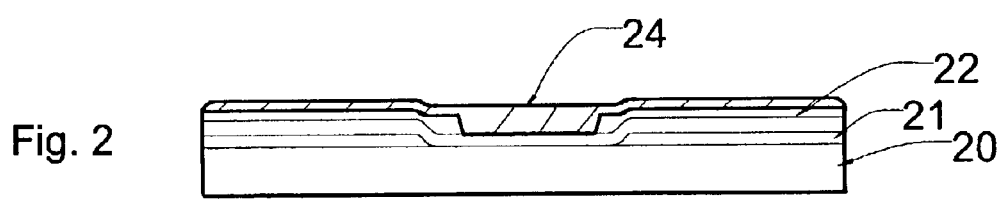

FIG. 2 shows the results of etchings and epitaxial re-growth culminating in the deposition of a metallic contact layer 24. The metallic contact layer 24 lies close to the cladding and confinement layers adjacent to the quantum well and waveguide layers which generate heat when the laser is in operation. Metallic layer 24 would typically be a composite N-metal layer comprised of titanium (~300 Å thick), platinum (~1000 Å thick) and gold (~300 Å thick), in which the outermost layer to be soldered to the heat sink would be gold.

Figure 3:
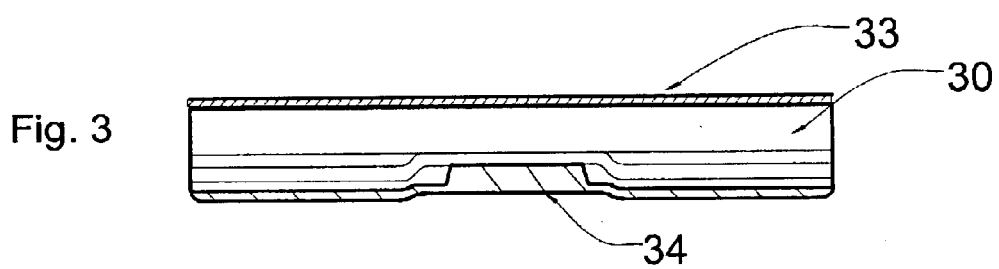
Figure 4:
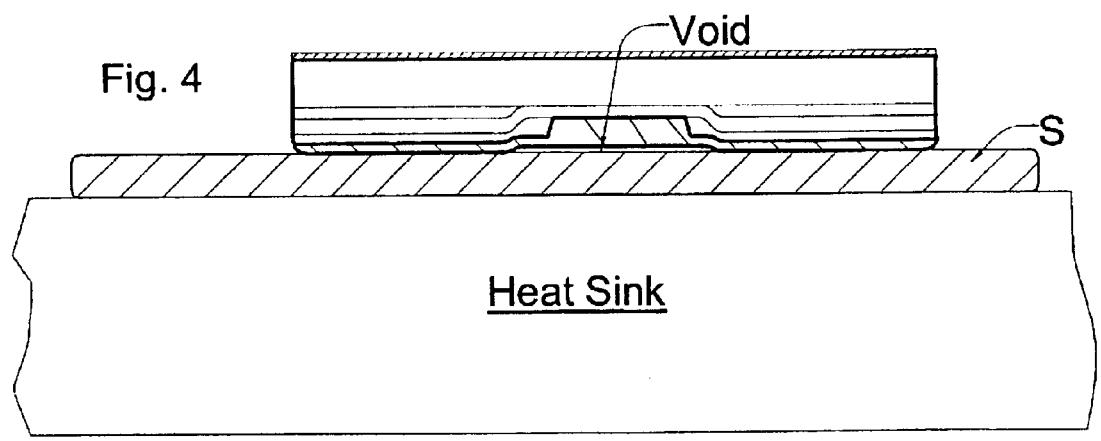
FIG. 4 shows a solid state device produced by the process of FIGS. 1–3 soldered to a heat sink and having a poor heat transmitting interface caused by gasses entrapped during soldering.

The heat from the device must be transmitted through the metallic contact layer 24 which forms and interface surface to a heat sink (shown in FIG. 4). However, because of the etching away of intermediate layers necessary to accommodate a grating layer and the metallic contact layer, the metallic contact layer may exhibit a typography that is not perfectly flat and whose central region may be somewhat depressed below its periphery, as shown greatly exaggerated in FIG. 2. After the contact stripe metallization, the opposite surface of the substrate will have a metallization layer 33 applied, as shown in FIG. 3. Finally, as shown in FIG. 4, the device's interface surface closest to the heat generating quantum well and waveguide layers is soldered to a heat sink. The solder layer S must transfer heat from the solid state device into the heat sink.

Unless the etching and regrowth processes have provided a metalized interface surface that is perfectly smooth, there is a distinct possibility that there may be one or more depressions, undulations or voids, shown greatly exaggerated in FIGS. 2 through 4 in the interface surface. Depressions as small as $0.2\mu$ can cause voids that will entrap gases when the solid state device is soldered to the heat sink. While the initial volume of any trapped gas may be quite small and may be made even smaller by the surface tension forces of the liquid solder, these entrapped gasses cannot be compressed to zero volume and will prevent the solder from wetting all of the interface surface. Gaps in solder coverage detract from the area available for heat transfer and give rise to hot spots that affect the useful life of the solid state device.

In accordance with the principles of our invention, a preferred solution to the problem of entrapped gasses is provided by introducing one or more vent notches or grooves in the interface surface between the chip and the heatsink. Such a groove or notch is dimensioned to effectively provide a gas vent and may advantageously be created during further processing of the chip, as illustrated in FIGS. 5 and 6. FIG. 5 shows the prior art chip of FIG. 3 inverted so that its interface surface can be further processed. In FIG. 6 a photoresist 71 is applied to the interface surface that is thinner where a notch is to be created. The photoresist is exposed to light and developed. Etchants 72 are then applied to create one or more vent notches that extend through the peripheral "rim" of the metallic interface surface towards its central area, such as shown in FIG. 7. The vents along the perimeter of the metalization layer allow the trapped gas to escape when the device is placed in a soldering chamber. Advantageously, before the solder is melted the pressure in the processing chamber may be reduced, as shown in FIG. 8. Referring to FIG. 8, the temperature and pressures applied in the soldering chamber are shown. The temperature is raised from point a to point b while the pressure is reduced to below atmospheric. At point b the solder melts and flows between the solid state device and the heat sink. The temperature is maintained between points c and d while the pressure is raised between points f and g to force solder into any voids. Gas that might have ordinarily been entrapped in a void and which would normally be compressed to prevent complete wetting of the interface surfaces is allowed to escape through the vent notches which allow solder to be pumped back in the spaced foremely occupied by the gasses. Although it may be impossible to completely eliminate entrapped gas, the final volume will be much smaller than has heretofore been attainable with prior art techniques.

Process (FIG. 8):

1. Preheat the part to be soldered in a vacuum chamber (points a to b).
2. When approaching the melting temperature, drop the chamber pressure to as low a value as practical. (e.g. 0.01 bar, points a' to b').
3. After the solder melts, increase the chamber pressure so that liquid solder is pumped into the pocket under the chip (points f to g).
4. Cool down, freezing solder (points d to e).

As an alternative, instead of notching the interface surface of the solid state device, the interface surface of the heat sink may be notched as shown in FIG. 9

In FIG. 10 an alternative to the foregoing procedures is shown which is applicable when an evaporative soldering procedure is employed. After the solder has been evaporated so as to coat or "tin" the chip interface surface and/or the heat sink surface, it may be useful to place a fine piece of solder wire on top of the heat sink which will provide a gas vent space when the solder is re-flowed. As the solder wire melts it allows gas to escape along the "fillet gap" between the circular periphery of the solder wire and the mating surfaces of the chip and the heat sink. In this manner, the wire provides vent spaces about its periphery for gas to escape during the solder reflow operation.

It was mentioned above that solder preforms may be used as an alternative to the evaporative soldering process to bond a chip to a heatsink. As was true of the evaporative soldering process, the problem of entrapped gas may also present itself here. To alleviate this problem a special solder preform, illustrated in FIG. 12 may be used which, in accordance with an alternative embodiment of the invention, includes one or more grooves to provide vent paths for gas.

FIG. 11 (not drawn to scale), shows a grooved heat sink 91 which has been tinned at 90 with evaporated solder. It is important neither to make the vent notch too shallow nor to employ excessive amount of evaporative tinning solder that would fill the vent notches and prevent the escape of gases. Illustratively, the depth V of the vent notch may be of the order of 2–5 $\mu$m with the thickness S of the solder 90 would be of the the order of about 3–20 $\mu$m. Note that when the correct amount of solder is used, the solder 90 conforms to the contour of the vent notch so as to provide a gas vent. When the heat is raised to reflow the solder, the pressue applied to hold the chip against the heat sink will bring all of the solder into contact with the device to provide a good heat transfer surface when the solder cools.

The foregoing describes the principles of the illustrative embodiment and process of the invention. It will be appreciated that some solid state devices may be provided with a contact surface that is of a "mesa" instead of a flat configuration shown. Further and other modifications will be apparent to those skilled in the art and may be made without departing from the spirit and scope of our invention.

What is claimed is:

1. In a solid state device having a mounting surface for bonding to a heat sink, said mounting surface exhibiting topographic irregularities, an arrangement for improving heat transfer through the interface between said solid state device and said heat sink, comprising:

at least one gas vent path in said interface, said vent path being dimensioned to provide for escape of gas from said topographic irregularities and the outer periphery of said mounting surface during said bonding, said vent path being etched into a re-grown surface of said solid state device.

2. An epitaxial device having a regrown surface for bonding to a heat sink, said re-grown surface exhibiting topographic variation, comprising a gas groove extending from an Inner portion to the periphery of said regrown surface; and a quantity of solder sufficient to provide bonding between said heat sink and said surface but insufficient to completely fill said gas groove.

3. An epitaxial device according to claim 2 wherein said gas groove is etched into said regrown surface.

* * * * *